(12) United States Patent
Ku et al.

(10) Patent No.: US 11,929,415 B2
(45) Date of Patent: Mar. 12, 2024

(54) THIN FILM TRANSISTORS WITH OFFSET SOURCE AND DRAIN STRUCTURES AND PROCESS FOR FORMING SUCH

(71) Applicant: Intel Corporation, Santa Clara, CA (US)

(72) Inventors: Chieh-Jen Ku, Hillsboro, OR (US); Pei-Hua Wang, Beaverton, OR (US); Bernhard Sell, Portland, OR (US); Travis W. Lajoie, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 948 days.

(21) Appl. No.: 16/447,880

(22) Filed: Jun. 20, 2019

(65) Prior Publication Data

US 2020/0403076 A1 Dec. 24, 2020

(51) Int. Cl.
*H01L 29/423* (2006.01)
*H01L 29/417* (2006.01)
*H01L 29/66* (2006.01)
*H10B 12/00* (2023.01)

(52) U.S. Cl.
CPC .. *H01L 29/42384* (2013.01); *H01L 29/41733* (2013.01); *H01L 29/41775* (2013.01); *H01L 29/66742* (2013.01); *H10B 12/00* (2023.02); *H10B 12/01* (2023.02)

(58) Field of Classification Search
None
See application file for complete search history.

(56) References Cited

U.S. PATENT DOCUMENTS

| | | | |
|---|---|---|---|
| 2011/0042670 A1* | 2/2011 | Sato | H01L 29/78621 257/E29.296 |
| 2014/0061810 A1 | 3/2014 | Sunamura | |
| 2014/0340953 A1* | 11/2014 | Yamazaki | H01L 29/78603 365/72 |
| 2015/0048359 A1* | 2/2015 | Fukase | H01L 29/42384 257/43 |
| 2016/0365440 A1* | 12/2016 | Suk | H01L 29/0673 |
| 2017/0317195 A1* | 11/2017 | Zhang | H01L 29/41733 |
| 2017/0323957 A1* | 11/2017 | Yamazaki | H01L 21/46 |
| 2018/0331227 A1* | 11/2018 | Ahmed | H01L 27/124 |
| 2019/0288118 A1* | 9/2019 | Song | H01L 29/7869 |
| 2020/0266289 A1* | 8/2020 | Yamazaki | H01L 21/02274 |

OTHER PUBLICATIONS

Search Report from European Patent Application No. 20163043.1, dated Aug. 12, 2020, 9 pgs.
Lee Suhui et al: "Bulk-Accumulation Oxide Thin-Film Transistor Circuits With Zero Gate-to-Drain Overlap Capacitance for High Speed", IEEE Electron Device Letters, IEEE Service Center, New York, NY, US, vol. 36, No. 12, Dec. 1, 2015 (Dec. 1, 2015), pp. 1329-1331.

* cited by examiner

*Primary Examiner* — Khaja Ahmad
(74) *Attorney, Agent, or Firm* — Schwabe, Williamson & Wyatt, P.C.

(57) ABSTRACT

A device is disclosed. The device includes a source contact and a drain contact, a first dielectric between the source contact and the drain contact, a channel under the source contact and the drain contact, and a gate electrode below the channel, the gate electrode in an area under the first dielectric that does not laterally extend under the source contact or the drain contact. A second dielectric is above the gate electrode and underneath the channel.

14 Claims, 14 Drawing Sheets

THIN FILM TRANSISTORS WITH OFFSET SOURCE AND DRAIN STRUCTURES AND PROCESS FOR FORMING SUCH

TECHNICAL FIELD

Embodiments of the disclosure pertain to thin film transistors and, in particular, to thin film transistors with offset source and drain structures.

BACKGROUND

In some thin film transistor designs the source region and the drain region can overlap with the space that is occupied by the gate electrode. The overlap area between gate electrode and the source region and the gate electrode and the drain region causes the generation of overlap capacitance (Cgs and Cgd) which can result in circuit delay. This is because the overlap capacitance is a parasitic capacitance that can reduce the switching speed of the transistor.

DESCRIPTION OF THE EMBODIMENTS

Figure 1:
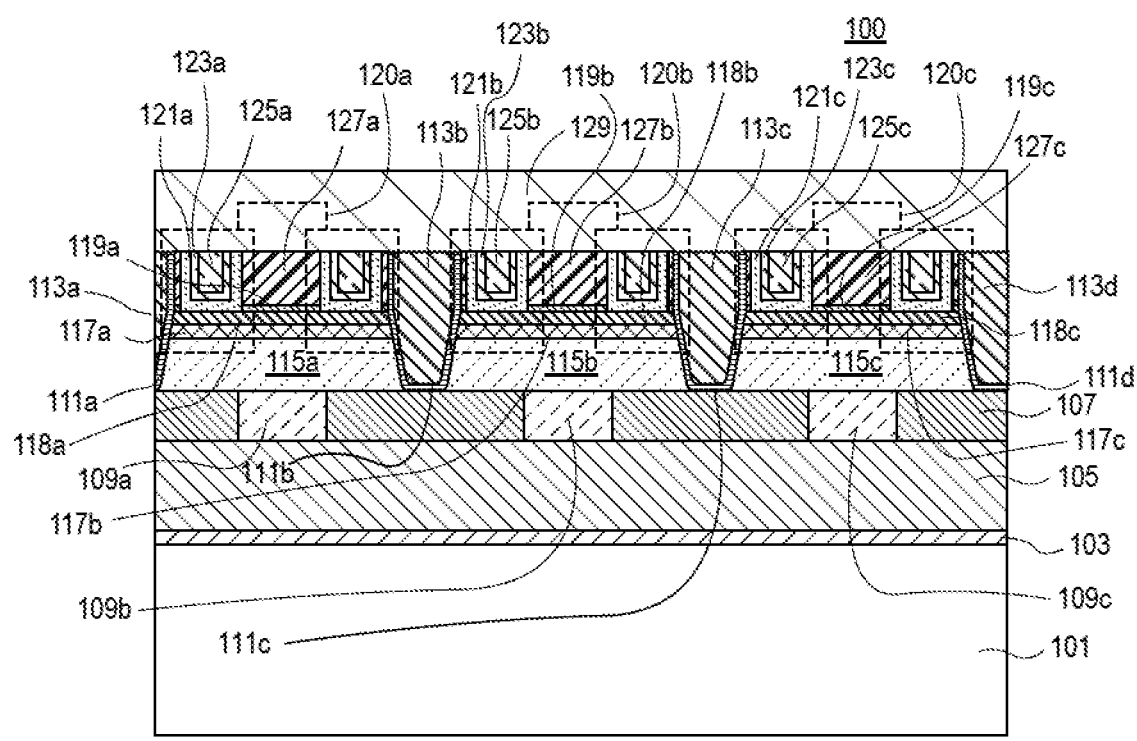
FIG. 1 illustrates thin film transistors of a previous approach.

Thin film transistors with offset source and drain structures are described. It should be appreciated that although embodiments are described herein with reference to example thin film transistors with offset source and drain structures implementations, the disclosure is more generally applicable to thin film transistors with offset source and drain structures implementations as well as other type thin film transistors with embedded bottom gate implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In some thin film transistor designs the source region and the drain region can overlap with the space that is occupied by the gate electrode. The overlap area between the gate electrode and the source region and the gate electrode and the drain region causes the generation of overlap capacitance (Cgs and Cgd) which can result in circuit delay. Delay can occur because the overlap capacitance is a parasitic capacitance that can reduce the switching speed of the transistor.

An approach that addresses the shortcomings of previous approaches is disclosed and described herein. For example, the bottom gate metal is embedded inside etch stop vias and is positioned in direct contact with a metal layer underneath. Because the drain and source regions do not overlap with the bottom gate electrode the cause of overlap capacitance is completely eliminated. The drain-source offset thin film transistor can operate at a higher speed.

FIG. 1 illustrates an embedded oxide thin film transistor 100 of a previous approach. In FIG. 1, the thin film transistor 100 includes dielectric layer 101, barrier layer 103, metal layer 105, etch stop layer 107, metal via 109a-109c, spacer 111, isolation dielectric structures 113, gate electrode 115a-115c, gate dielectric layers 117a-117c, channel region 118a-118c, thin dielectric layers 119a-119c, source-drain contact layers 121a-121c, source-drain contact layers 123a-123c, source-drain conductor 125, interlayer dielectric (ILD) regions 127a-127c, and sacrificial dielectric 129.

Referring to FIG. 1, the dielectric layer 101 forms the lower part of the thin film transistor 100. The barrier layer 103 is formed above the dielectric layer 101. The metal layer 105 is formed over the barrier layer 103. The etch stop layer 107 is formed over the metal layer 105. The conductor vias 109a-109c are formed in the etch stop layer 107 and above the metal layer 105. The gate electrodes 115a-115c are formed above the etch stop layer 107 and above the conductor vias 109a-109c. The isolation dielectric 113 extends into the body of the transistor structure 100 and separates active regions of the device. The spacers 111a-111d surround the isolation dielectric structures 113a-113d. The gate dielectric layers 117a-117c are formed above the gate electrodes 115a-115c. The channel regions 118a-118c are formed above the gate electrodes 115a-115c. The thin dielectric layers 119a-119c are formed above the channel regions 118a-118c and below the ILD regions 127a-127c. In addition, the thin dielectric layers 119a-119c is formed between the source and the drain contacts. The source-drain contacts 120a-120c include source-drain contact layers 121a-121c, source-drain contact layers 123a-123c and source-drain contact layers 125a-125c. The source-drain contact layers 121a-121c line the space formed in ILD regions 127a-127c for the source-drain contacts 120a-120c. The source-drain contact layers 123a-123c are formed on the source-drain contact layers 121a-121c. The source-drain contact layers 125a-125c are formed in a space defined by the source-drain contact layers 123a-123c. In FIG. 1, the gate electrodes 115a-115c extend underneath the source-drain contacts 120a-120c. In FIG. 1, the gate electrodes 115a-115c extend across the entire bottom portions of the source-drain contacts 120a-120c.

In operation, because of the overlap area between the source-drain contacts 120a-120c and the gate electrodes 115a-115c an overlap capacitance can be generated in both the source-to-gate region and the drain-to-gate region. These parasitic capacitances have a direct impact on the speed of operation of the transistor as they can cause switching delays. In particular, the increased capacitance operates to reduce the speed of operation of the transistor.

Figure 2A:
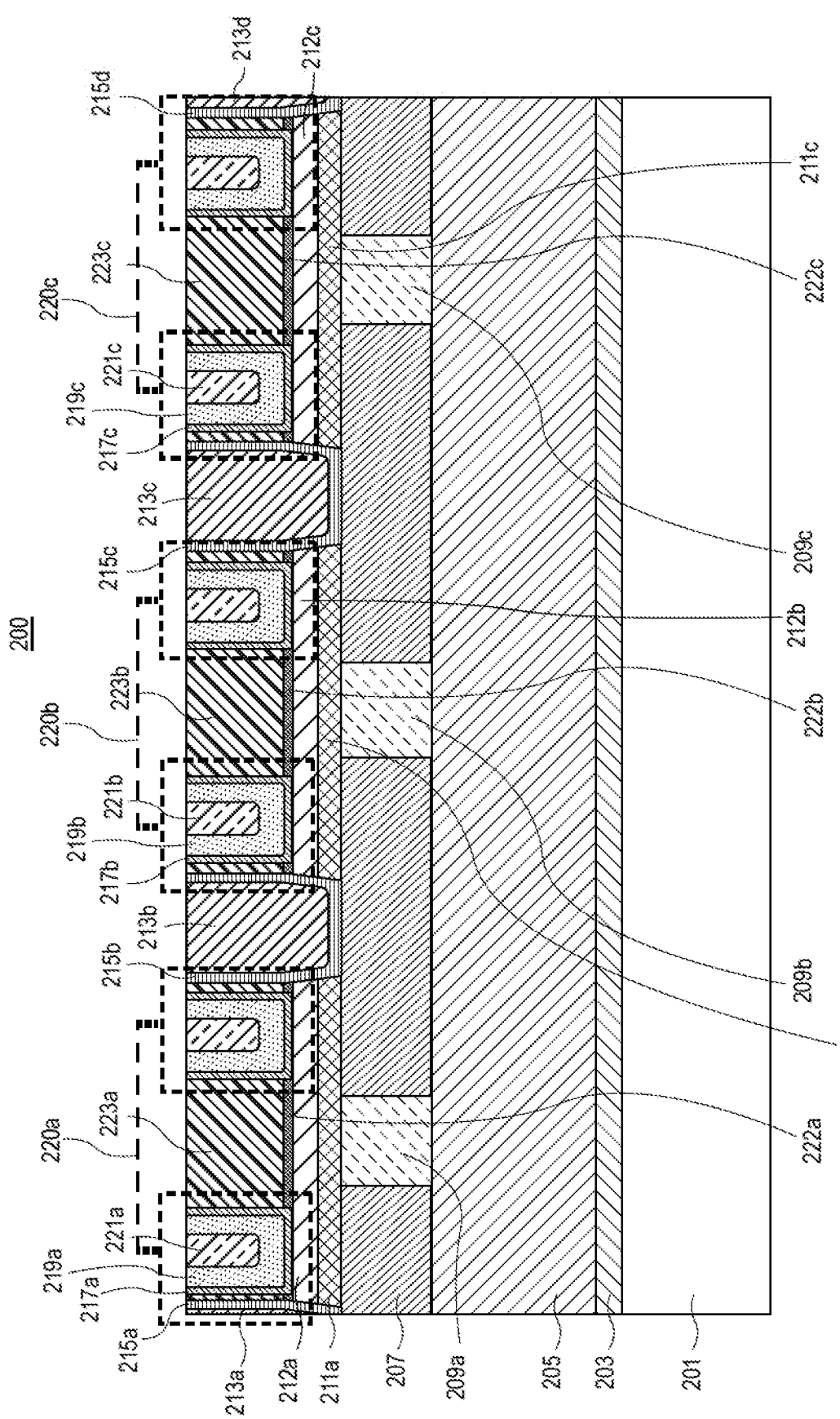
FIG. 2A illustrates thin film transistors with an embedded gate according to an embodiment.

FIG. 2A illustrates a thin film transistor structure 200 according to an embodiment. In an embodiment, as shown in FIG. 2A, the thin film transistor structure 200 can include dielectric layer 201, barrier layer 203, conductor layer 205, etch stop layer 207, gate electrode/conductor vias 209a-209c, gate dielectric layers 211a-211c, channel regions 212a-212c, isolation dielectric structures 213a-213d, spacers 215a-215d, source-drain contact layers 217a-217c, source-drain contact layers 219a-219c, source-drain contact layers 221a-221c, thin dielectric layers 222a-222c, and ILD regions 223a-223c.

Referring to FIG. 2A, in an embodiment, the dielectric layer 201 can be at the base the thin film transistor structure 200. In an embodiment, the barrier layer 203 can be formed above the dielectric layer 201. In an embodiment, the conductor layer 205 can be formed over the barrier layer 203. In an embodiment, the etch stop layer 207 can be formed over the conductor layer 205. In an embodiment, the etch stop layer 207 can have a thickness of 10-30 nm. In other embodiments, the etch stop layer 207 can have other thicknesses. In an embodiment, portions of the etch stop layer 207 can be separated by vias of width 20-40 nm (e.g., electrode/conductor vias 209). In other embodiments, the portions of the etch stop layer 207 can be separated by vias that have other lengths. In an embodiment, the gate electrode/conductor vias 209 can be formed in the etch stop layer 207 and above the conductor layer 205. In an embodiment, the conductor layer 205 can be an interconnect layer formed underneath the gate electrodes/conductor vias 209a-209c. In an embodiment, the top of the gate electrodes/conductor via 209a-209c can be directly connected to the channel regions 212a-212c and the bottom of the gate electrodes/conductor vias 209a-209c can be directly connected to the conductor layer 205. In other embodiments, the top of the gate electrodes/conductor vias 209a-209c may not be directly connected to the channel regions 212a-212c and the bottom of the gate electrodes/conductor vias 209a-209c may not be directly connected to the conductor layer 205. In an embodiment, the gate electrodes/conductor vias 209a-209c may not extend underneath the source-drain regions 220a-220c. In an embodiment, the gate electrode/conductor vias 209a-209c can have a thickness of 10-30 nm. In other embodiments, the gate electrode/conductor vias 209a-209c can have other thicknesses. In an embodiment, the gate electrode/conductor vias 209a-209c can have a width of 20-40 nm. In other embodiments, the gate electrode/conductor vias 209a-209c can have other widths. In an embodiment, the width of the gate electrode/conductor vias 209a-209c can be less than the width of portions of the ILD regions 223a-223c between the source and drain contacts of source-drain contacts 220a-220c. In an embodiment, the gate electrode/conductor vias 209a-209c can be located underneath the portions of the ILD regions 223a-223c between source and drain contacts of the source-drain contacts 220a-220c. In an embodiment, the isolation dielectric structures 213a-213d can extend downward and separate the channel regions 212a-212c. In an embodiment, the spacers 215a-215d can be formed around the isolation dielectric structures 213a-213d. In an embodiment, the gate dielectric layers 211a-211c can be formed above the gate electrode/conductor vias 209a-209c and across the top surfaces of the etch stop layer 207. In an embodiment, the channel regions 212a-212c can be formed above the gate dielectric layers 211a-211c. In an embodiment, the thin dielectric layers 222a-222c can be formed above the channel regions 212a-212c and below the portions of the ILD regions 223a-223c that are formed between source and drain contacts of the source-drain contacts 220a-220c. In addition, in an embodiment, the thin dielectric 222a-222c can be formed between the source and the drain contacts. In an embodiment, the source and drain contacts can include source-drain contact layers 217a-217c, source-drain contact layers 219a-219c and source-drain contact layers 221a-221c. In an embodiment, the source-drain contact layers 217a-217c line the space formed in ILD regions 223a-223c for the source and drain contacts of source-drain contacts 220a-220c. In an embodiment, the source-drain contact layers 219a-219c can be formed on the source-drain contact layers 217a-217c. In an embodiment, the source-drain contact layers 221a-221c are formed in a space defined by the source-drain contact layers 219a-219c. In an embodiment, the source and drain contacts can include a plurality of conductor layers as is shown in FIG. 2A. In other embodiments, the source and drain contacts can include a single conductor layer. In an embodiment, a sacrificial dielectric (not shown) can be formed across the top of the thin film transistor structure 200 above the source and drain contacts of source-drain contact structures 220a-220c, the ILD regions 223a-223c, the isolation dielectric structures 213a-213d and the spacers 215a-215d.

In an embodiment, dielectric layer 201 can be formed from a low-k dielectric. In other embodiments, dielectric layer 201 can be formed from other materials. In an embodiment, barrier layer 203 can be formed from cobalt, ruthenium, indium oxide, tungsten nitride, or titanium nitride. In other embodiments, the barrier layer 203 can be formed from other materials. In an embodiment, metal layer 205 can be formed from copper. In other embodiments, the metal layer can be formed from other materials. In an embodiment, etch stop layer 207 can be formed from nitride based etch stop materials such as SiNi. In other embodiments, the etch stop layer 207 can be formed from other materials. In an embodiment, the gate electrodes/conductor vias 209a-209c can be formed from TiN, W, or TaN. In other embodiments, the gate electrodes/conductor vias 209a-209c can be formed from other materials. In an embodiment, the gate dielectric layers 211a-211c can be formed from ZrOx, HfOx, AlOx or SiOx. In other embodiments, the gate dielectric layers 211a-211c can be formed from other materials. In an embodiment, the channel regions 212a-212c can be formed from silicon oxide (e.g., adamantine). In other embodiments, the channel regions 212a-212c can be formed from other materials. In an embodiment, the isolation dielectric structures 213a-213d can be formed from silicon nitride. In other embodiments, the isolation dielectric structures 213a-213d can be formed from other materials. In an embodiment, the spacers 215a-215d can be formed from nitrides and/or oxides. In other embodiments, the spacers 215a-215d can be formed from other materials. In an embodiment, the source-drain contact layers 217a-217c can be formed from TiN, W, or TaN. In other embodiments the source-drain contact layers 217a-217c can be formed from other materials. In an embodiment, source-drain contact layers 219a-219c can be formed from TiN, W, or TaN. In other embodiments the source-drain contact layers 219a-219c can be formed from other materials. In an embodiment, the source-drain contact layers 221a-221c can be formed from TiN, W, or TaN. In other embodiments the source-drain contact layers 221a-221c can be formed from other materials. In an embodiment, the thin dielectric layers 222a-222c can be formed from an oxide. In other embodiment, the thin dielectric layers 222a-222c can be formed from other materials. In an embodiment, the ILD regions 223a-223c can be formed from a nitride and/or oxide material. In other embodiment, the ILD regions 223a-223c can be formed from other materials.

In operation, because the gate electrodes/conductor vias 209a-209c are prevented from extending into the areas underneath the source-drain contacts 220a-220c, overlap capacitance is eliminated in the source-to-gate and drain-to-gate regions. The elimination of these parasitic capacitances has a direct impact on the speed of operation of the transistor. In particular, the elimination of these parasitic capacitances can cause an increase in the speed of operation of the transistor. In an embodiment, the elimination of these overlapping and parasitic capacitances can result in a substantial increase in the speed of operation of the transistor.

Figure 2B:
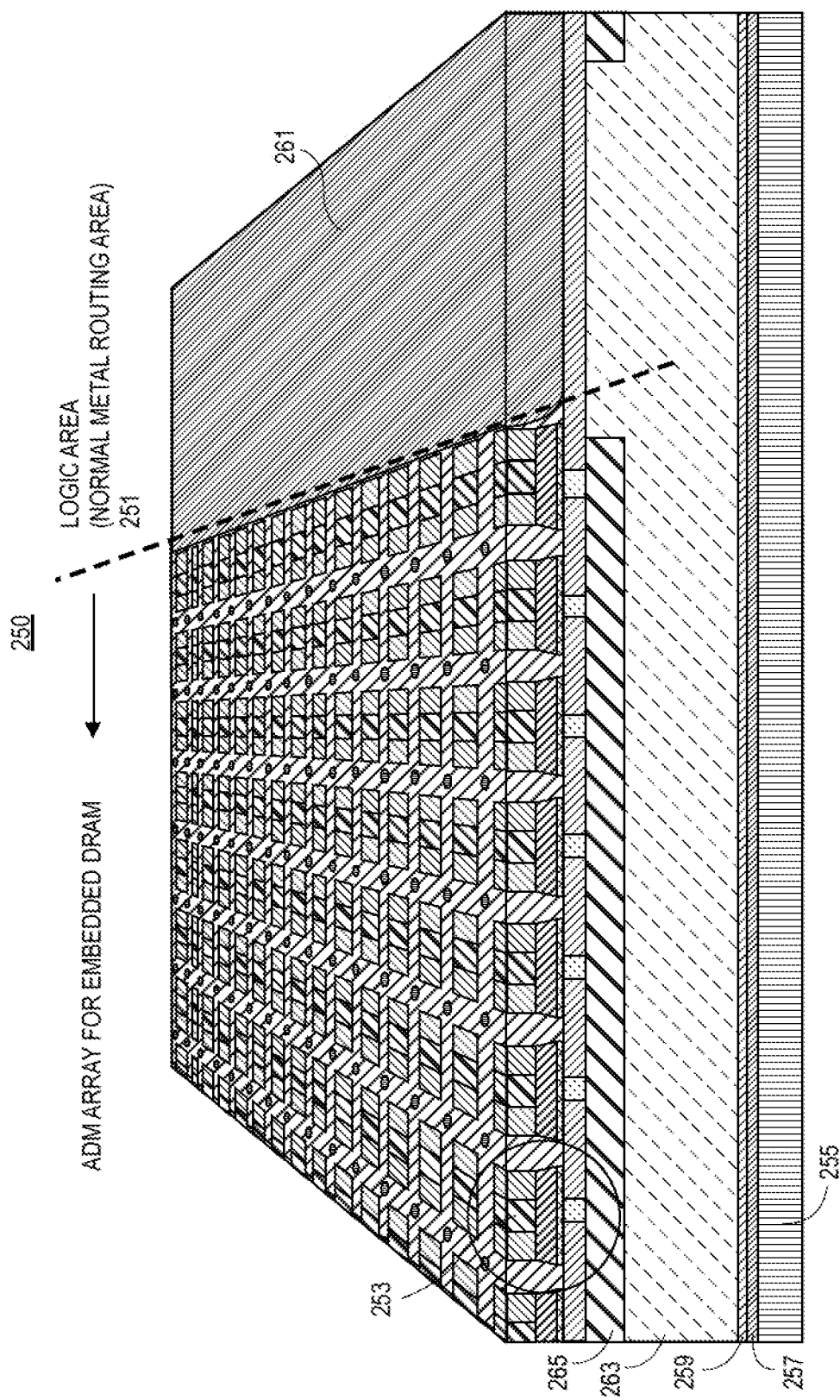
FIG. 2B illustrates a DRAM memory system that includes an array of thin film transistors according to an embodiment.

FIG. 2B illustrates a DRAM memory system 250 that includes an array of thin film transistors according to an embodiment. In an embodiment, as shown in FIG. 2B, the DRAM memory system can include logic area 251, DRAM memory cell 253, substrate 255, pad oxide 257, etch stop layer 259, ILD/via layer 261, low-k ILD/via layer 263, and conductor layer 265.

Referring to FIG. 2B, the DRAM device 250 includes memory cells 253 that include transistors that have a structure similar to that of transistor structures 200 in FIG. 2A. In the FIG. 2B embodiment, the DRAM memory system 250 includes the memory cells 253 and the logic area 251 for accommodating logic circuitry that control access to the memory cells. In other embodiments, the transistor structures (e.g., 200 in FIG. 2A) can be used in other type memory systems or devices. In an embodiment, structures in FIG. 2B, that are the same as structures shown in FIG. 2A can be formed form the materials discussed with reference to FIG. 2A. In an embodiment, the substrate 255 can be formed from silicon, germanium, indium antimonide, lead telluride, indium arsenide, indium phosphide, gallium arsenide, indium gallium arsenide, or gallium antimonide. In other embodiments, the substrate 255 can be formed from other materials. In an embodiment, the etch stop layer 259 can be formed from C doped SiN. In other embodiments, the etch stop layer 259 can be formed from other materials.

Figure 3A:
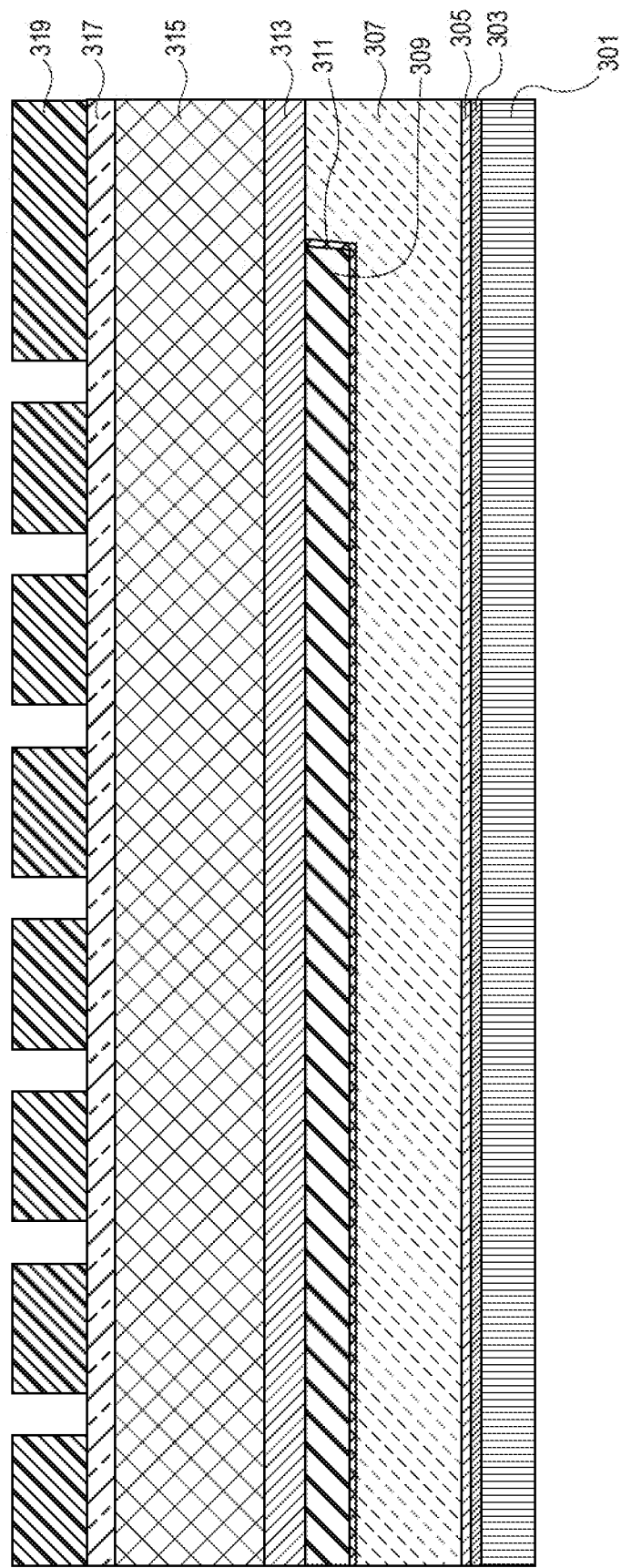
FIGS. 3A-3I illustrate cross-sections of a thin film transistor structure during a process of fabricating such according to an embodiment.

FIGS. 3A-3I shows cross-sections of a thin film transistor structure according to an embodiment. Referring to FIG. 3A, after one or more operations a structure is formed that includes substrate 301, interlayer material 303, interlayer material 305, interlayer dielectric 307, conductor layer 309, barrier layer 311, etch stop layer 313, carbon hardmask 315, SiArc 317, and photoresist pattern 319. The photoresist pattern 319 shown in FIG. 3A is formed as a part of the patterning of gate electrodes/conductor vias (see FIG. 3B).

Figure 3B:
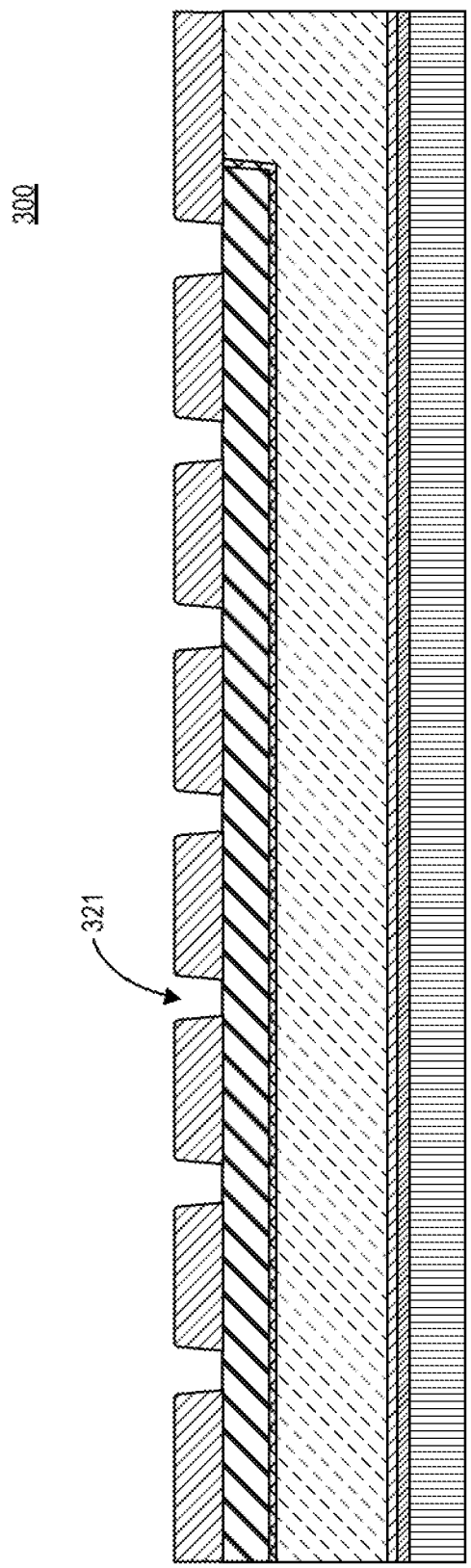

Referring to FIG. 3B, subsequent to one or more operations that result in a cross-section of the structure shown in FIG. 3A, vias 321 for a bottom gate are formed. In an embodiment, the vias 321 can be formed by isotropic, anisotropic, plasma etching, ion milling or sputter etching. In other embodiments, the vias 321 can be formed in other manners. As part of the process of forming the vias 321 the carbon hard mask 315, the SiARC 317, and photoresist 319 are removed.

Figure 3C:
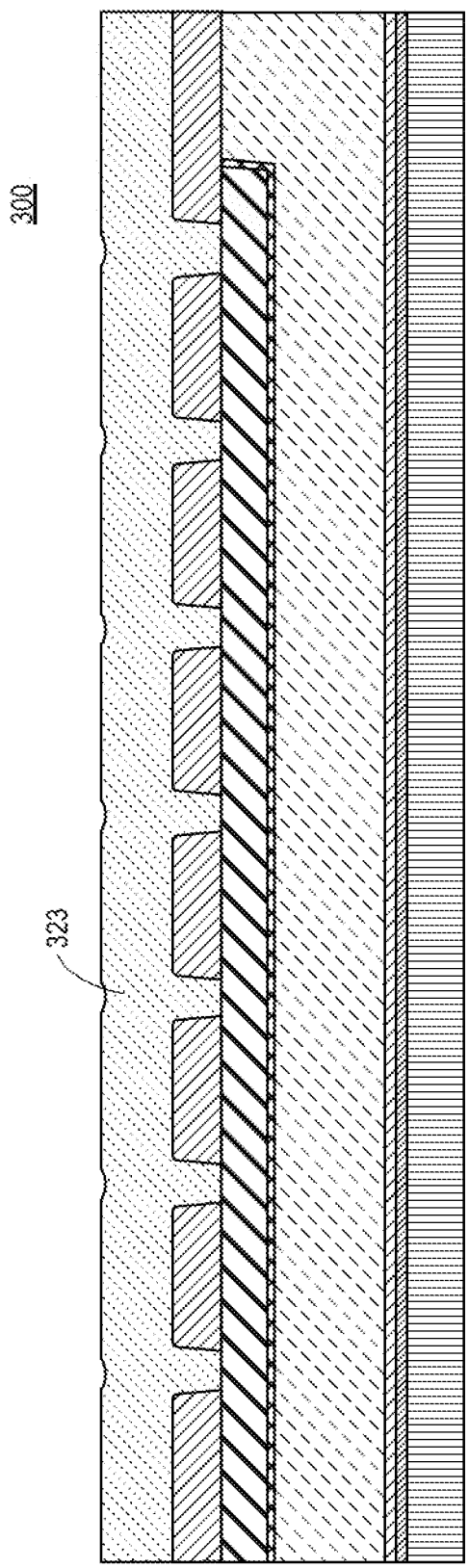

Referring to FIG. 3C, subsequent to one or more operations that result in the cross-section shown in FIG. 3B, gate electrode material 323 is formed on the structure 300 filling the vias 321. In an embodiment, the vias 321 can be filled by atomic layer deposition (ALD), physical vapor deposition (PVD), chemical vapor deposition (CVD), electrochemical deposition (ECD), or molecular beam epitaxy (MBE). In other embodiments, the gate electrode material can be formed in other manners. In an embodiment, the gate that is formed is a bottom gate.

Figure 3D:
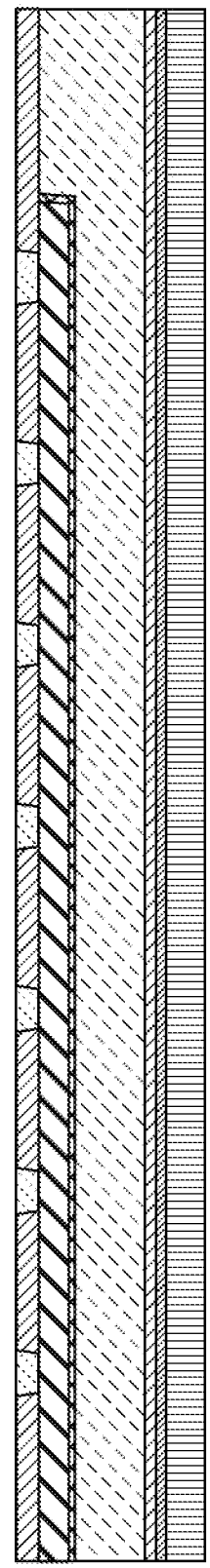

Referring to FIG. 3D, subsequent to one or more operations that result in a cross-section shown in FIG. 3C, portions of the gate conductor material 323 and the etch stop material 313 can be removed. In an embodiment, the top portions of the gate conductor material 323 and the etch stop material 313 can be removed by polishing. In an embodiment, the gate conductor material 323 and the etch stop material 313 is polished to a thickness of 10-30 nm. In other embodiments, the gate conductor material 323 and the etch stop material 313 is polished to another thickness. In an embodiment, the gate conductor material 323 and the etch stop material 313 can be polished by chemical mechanical polishing (CMP). In other embodiments, the gate conductor material and the etch stop material 313 can be polished in other manners.

Figure 3E:
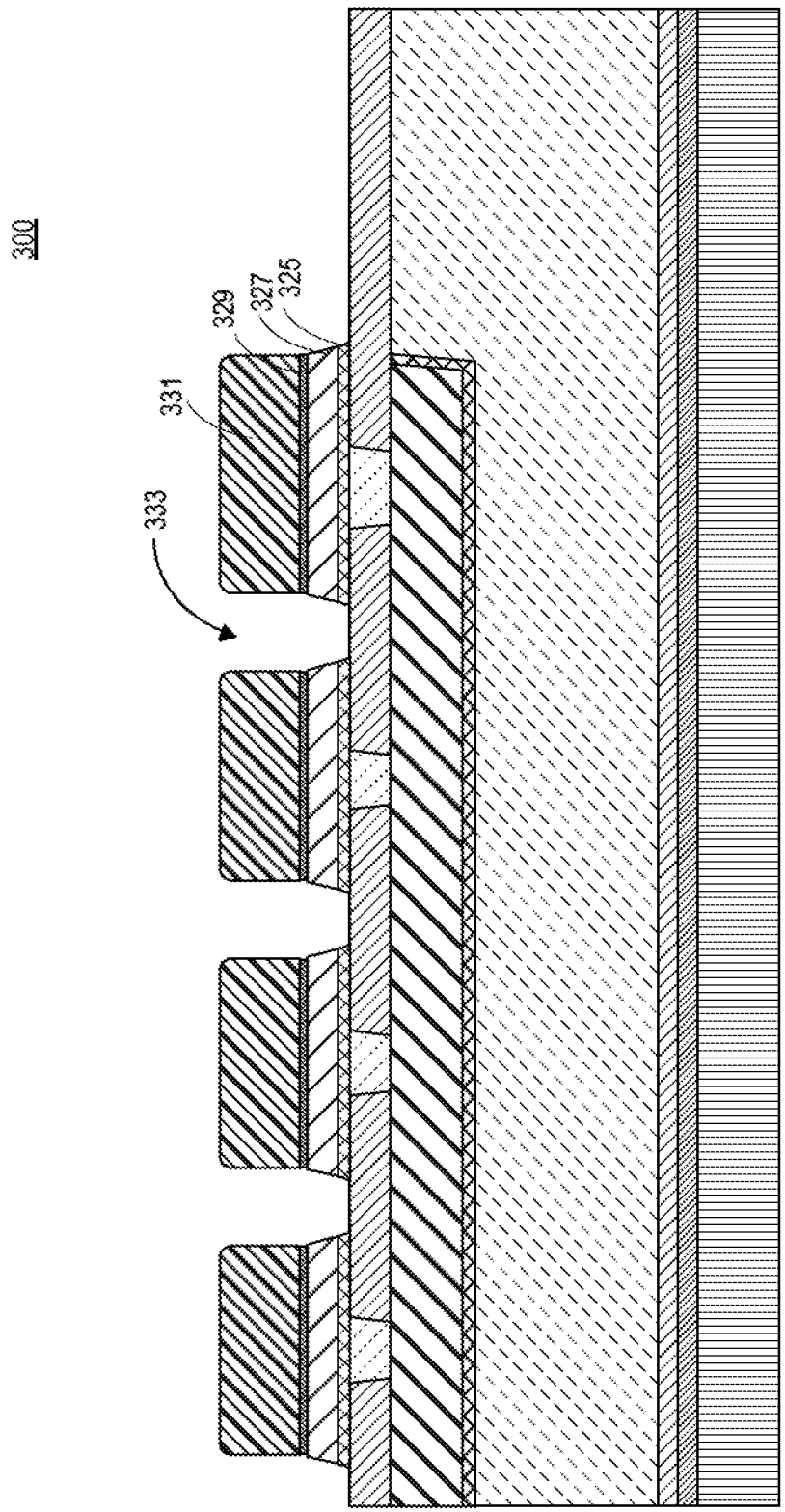

Referring to FIG. 3E, subsequent to one or more operations that result in a cross-section shown in FIG. 3D, the transistor active regions are formed. As part of the formation of the transistor active regions, gate dielectrics 325, channel layers 327, thin dielectric layer 329, ILD layers 331 are formed. In an embodiment, the gate dielectric 325, the channel layer 327, the thin dielectric layer 329, and the ILD layer 331 can be formed by atomic layer deposition (ALD), physical vapor deposition (PVD), chemical vapor deposition (CVD), electrochemical deposition (ECD), or molecular beam epitaxy (MBE). In other embodiments, the gate dielectric 325, the channel layer 327, the thin dielectric layer 329, and the ILD layer 331 can be formed in other manners. FIG. 3A shows the cross-section after an isolation etch has been performed to define transistor regions. This process defines isolation gaps 333 between the transistor regions.

Figure 3F:
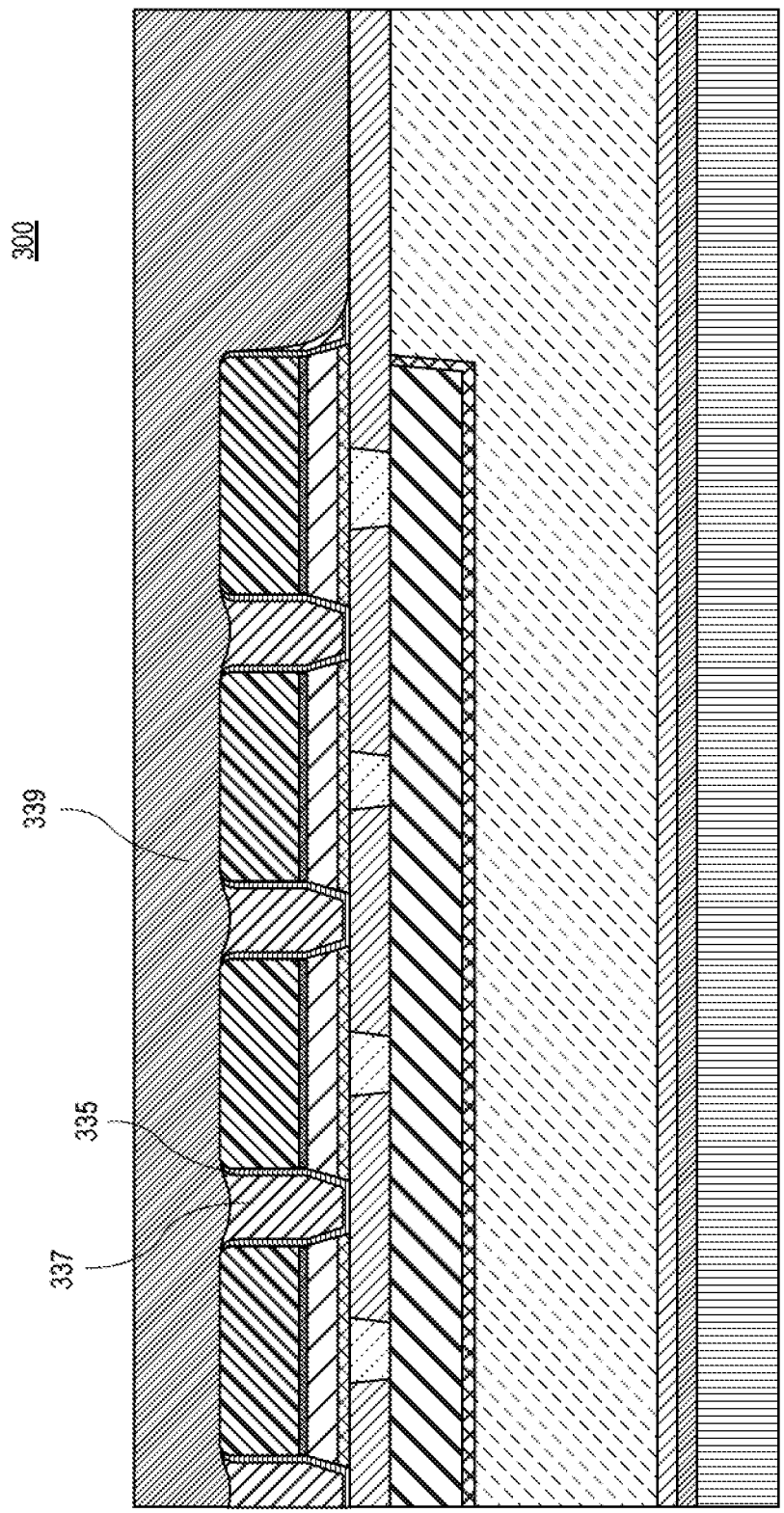

Referring to FIG. 3F, subsequent to one or more operations that result in the cross-section shown in FIG. 3E, a spacer 335 is formed in the isolation gaps 333 and the resultant space is filled with dielectric material 337. Thereafter, an ILD 339 is formed on the structure above the transistor regions. In an embodiment, the spacer 335, the dielectric material 337, and the ILD 339 can be formed on the structure above the transistor regions by atomic layer deposition (ALD), physical vapor deposition (PVD), chemical vapor deposition (CVD), electrochemical deposition (ECD), or molecular beam epitaxy (MBE). In other embodiments, the spacer 335, the dielectric material 337, and the ILD 339 can be formed on the structure 300 in other manners.

Figure 3G:
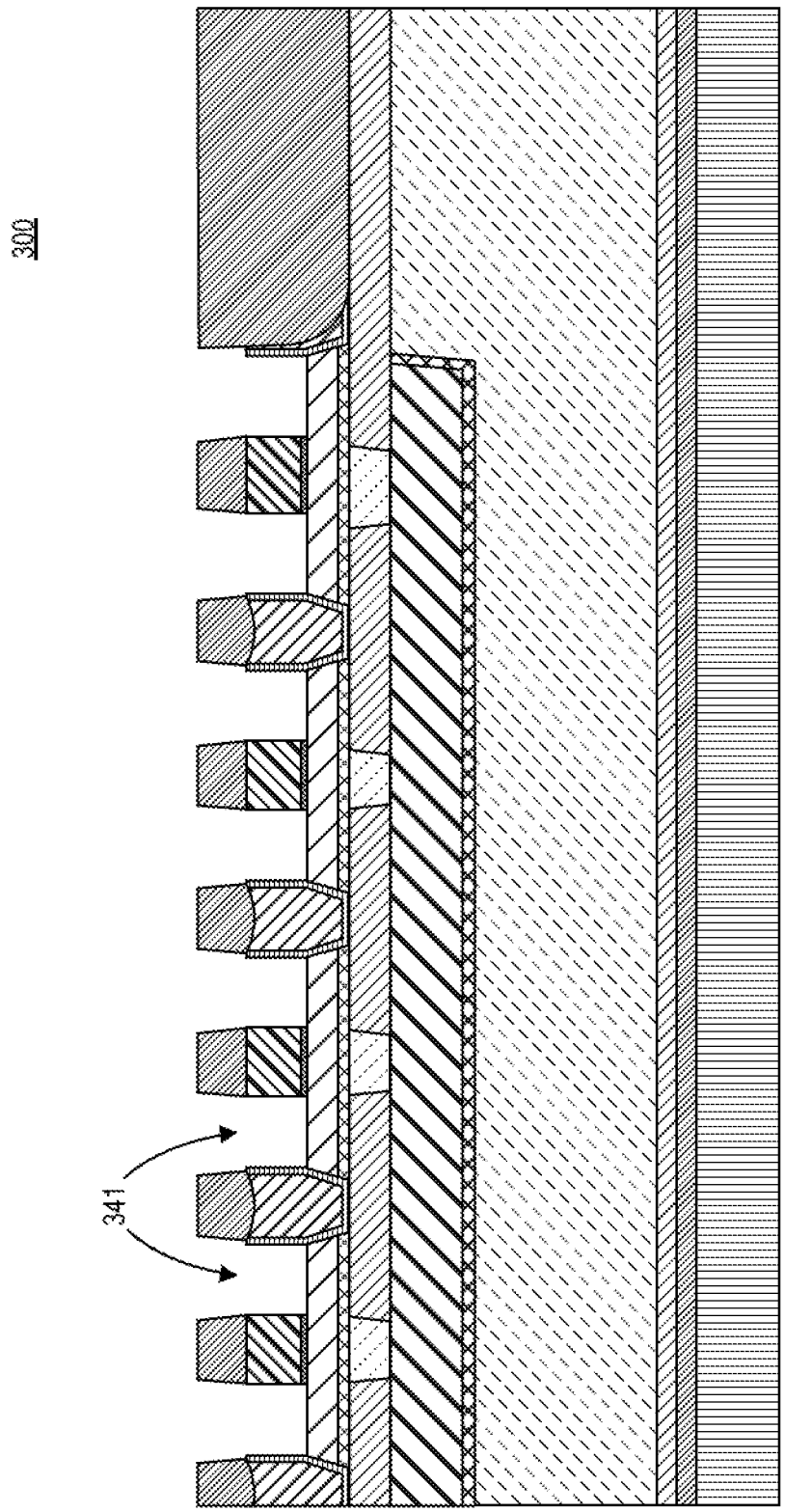

Referring to FIG. 3G, subsequent to one or more operations that result in the cross-section shown in FIG. 3F, source and drain contact holes 341 are formed above the channel layer 327. In an embodiment, the source and drain contact holes 341 are formed by patterning and etching. In an embodiment, the contact holes 341 can be formed in other manners.

Figure 3H:
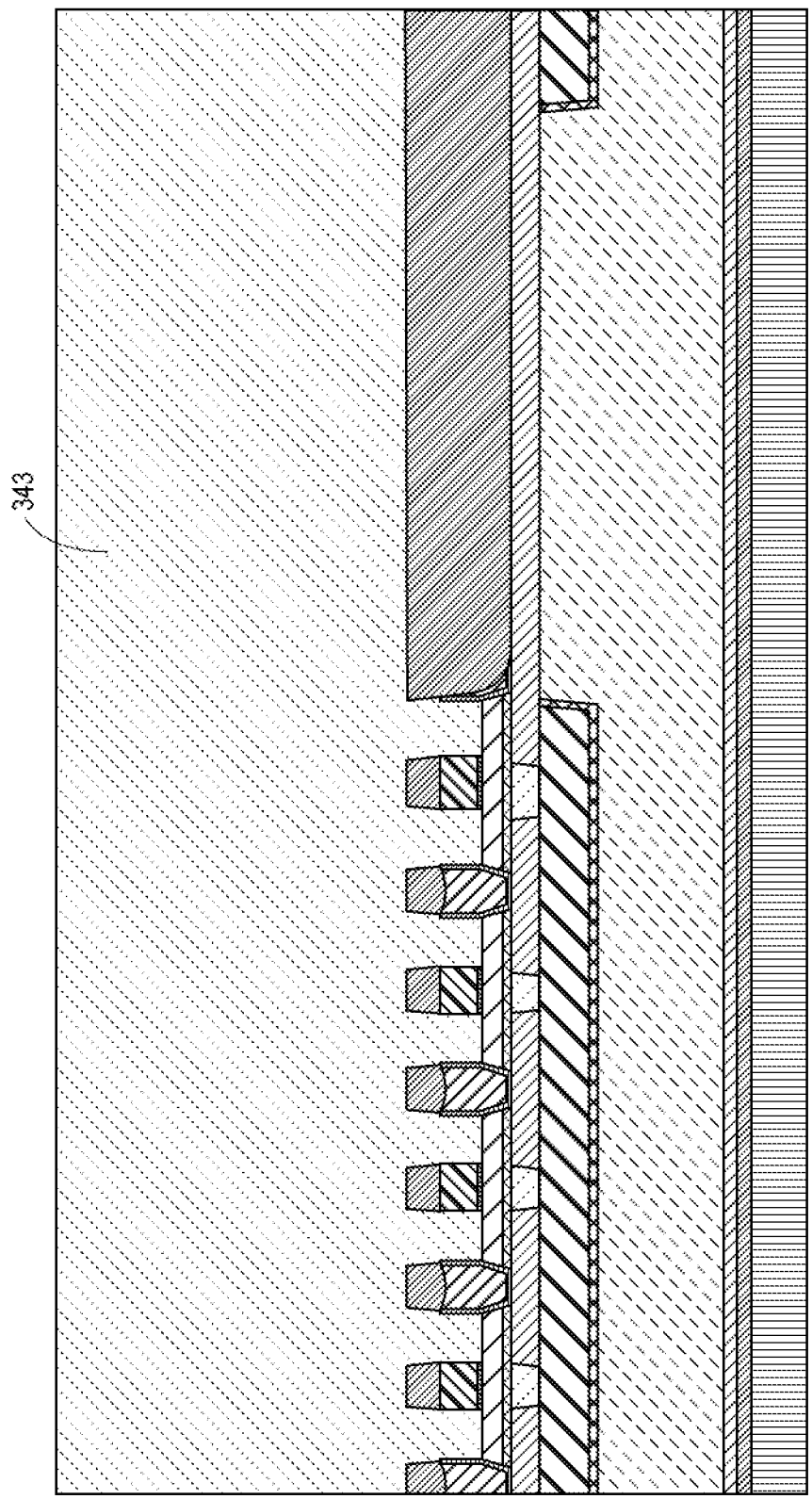

Referring to FIG. 3H, subsequent to one or more operations that result in the cross-section shown in FIG. 3G, source and drain conductor material 343 is formed above the structure 300 and in the contact holes 341. In an embodiment, the source and drain conductor material 343 can be formed on the structure 300 across transistor regions by atomic layer deposition (ALD), physical vapor deposition (PVD), chemical vapor deposition (CVD), electrochemical deposition (ECD), or molecular beam epitaxy (MBE). In other embodiments, the source and drain conductor material 343 can be formed on the top surface of the structure 300 and in the contact holes 341 in other manners. In an embodiment, the source and drain conductor material 343 can include a single conductor layer. In other embodiments, the source and the drain conductor material 343 can include a plurality of layers of conductors.

Figure 3I:
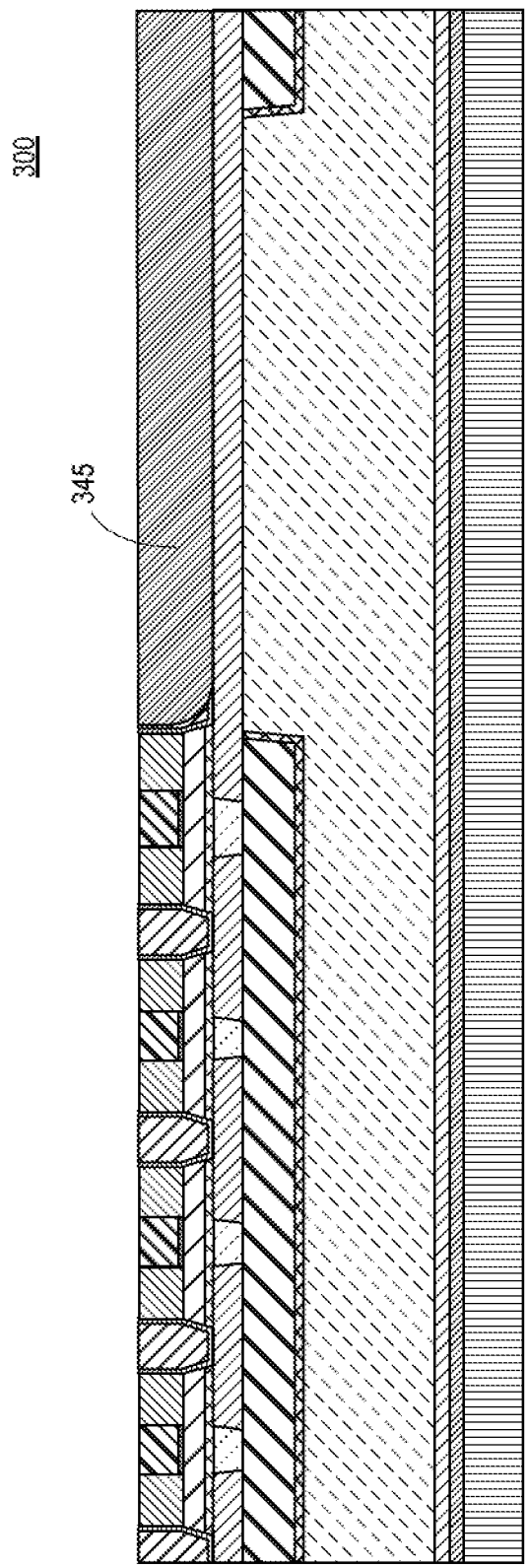

Referring to FIG. 3I, subsequent to one or more operations that result in the cross-section shown in FIG. 3H, a source and drain conductor polish is performed. As part of the source and the drain conductor polish, the source and the drain conductor material 343 is polished back. In addition, portions of the ILD layer 339 and other surrounding dielectric material is removed. Thereafter, post array processing is performed. In an embodiment, the logic area can include a low-k ILD 345 for normal metallization process.

Figure 4:
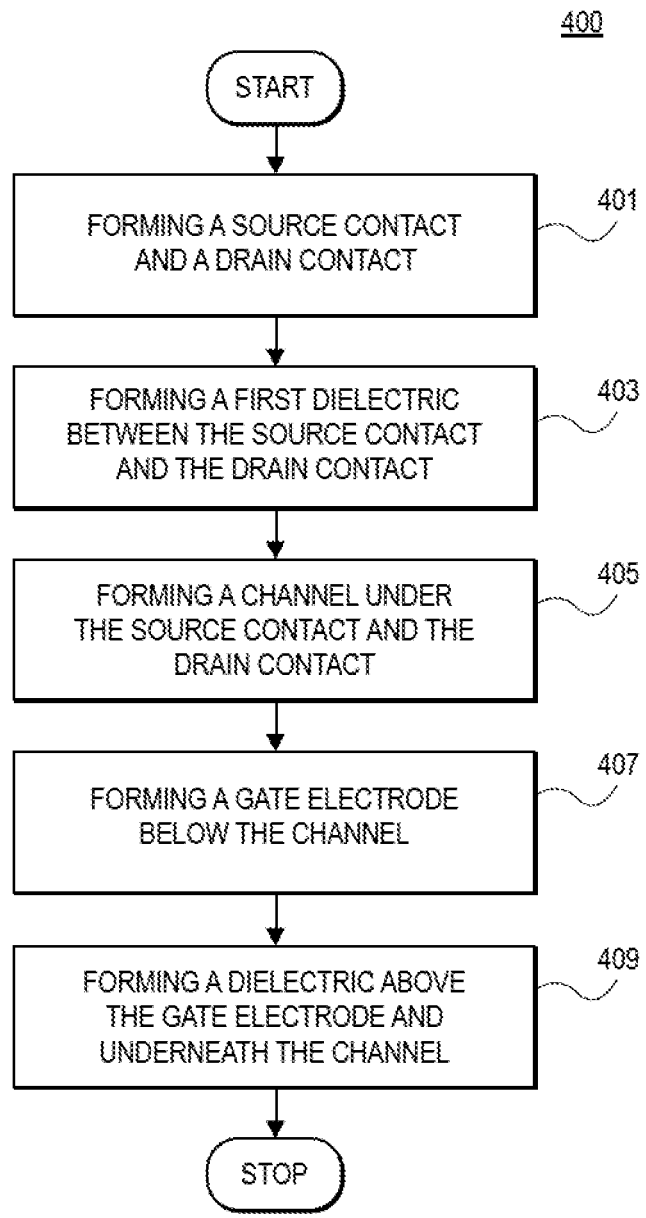
FIG. 4. illustrates a flowchart of a process of fabricating thin film transistors with offset source and drain structures according to an embodiment.

FIG. 4 is a method for forming a transistor according to an embodiment. At 401, forming a source contact and a drain contact. At 403, forming a first dielectric between the source contact and the drain contact. At 405, forming a channel under the source contact and the drain contact. At 407, forming a gate electrode below the channel, the gate electrode occupying an area under the first dielectric that does not laterally extend under the source contact or the drain contact. At 409, forming a second dielectric above the gate electrode and underneath the channel.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, or aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, or silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
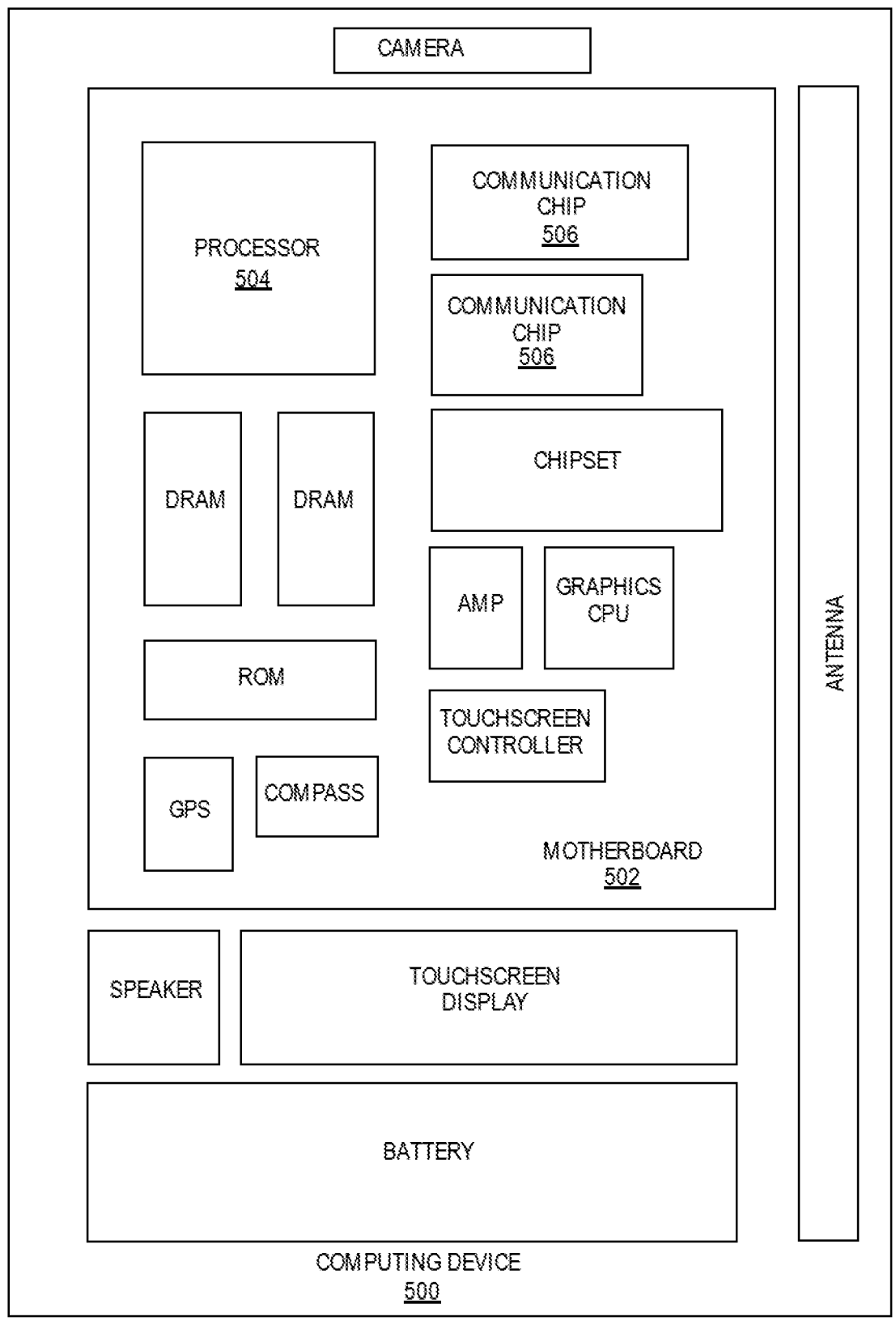
FIG. 5 illustrates a computing device in accordance with one implementation of an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, memory and/or logic systems of computing device 500 (such as but not limited to DRAM and/or DRAM that is embedded in logic) can include memory structures such as the memory structures 200 described herein with reference to FIG. 2A.

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
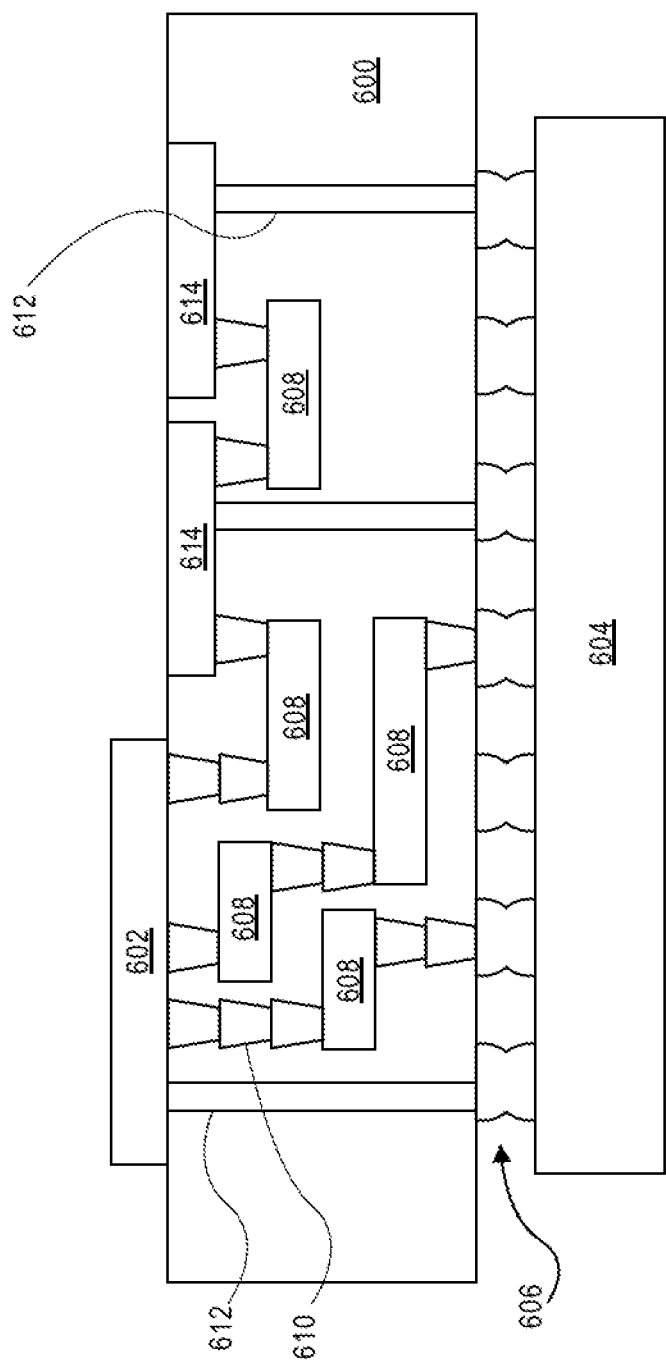
FIG. 6 illustrates an interposer that includes one or more embodiments.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A device including a source contact and a drain contact, a first dielectric between the source contact and the drain contact, a channel under the source contact and the drain contact, a gate electrode below the channel, the gate electrode in an area under the first dielectric that does not laterally extend under the source contact or the drain contact, and a second dielectric above the gate electrode and underneath the channel.

Example embodiment 2: The device of example embodiment 1, wherein the gate electrode includes a conductive via.

Example embodiment 3: The device of example embodiment 1 or 2, further comprising an etch stop layer, wherein the gate electrode is formed in the etch stop layer.

Example embodiment 4: The device of example embodiment 1, 2 or 3, further comprising an interconnect layer underneath the gate electrode, wherein the top of the gate electrode is directly connected to the channel and the bottom of the gate electrode is directly connected to the interconnect layer.

Example embodiment 5: The device of example embodiment 1, 2, 3, or 4, wherein the width of the gate electrode is from 20 to 40 nm.

Example embodiment 6: The device of example embodiment 1, 2, 3, 4, or 5, wherein the thickness of the gate electrode is from 10 to 30 nm.

Example embodiment 7: The device of example embodiment 1, 2, 3, 4, 5, or 6, wherein the source contact and the drain contact include a plurality of layers of materials.

Example embodiment 8: A system including one or more processing components, and one or more data storage components, the data storage components including at least one device, the at least one device including, a source contact and a drain contact, a first dielectric between the source contact and the drain contact, a channel under the source contact and the drain contact; a gate electrode below the channel, the gate electrode occupying an area under the first dielectric that does not laterally extend under the source contact or the drain contact, and a second dielectric above the gate electrode and underneath the channel.

Example embodiment 9: The system of example embodiment 8, wherein the gate electrode includes a conductive via.

Example embodiment 10: The system of example embodiment 8, or 9, further comprising an etch stop layer, wherein the gate electrode is formed in the etch stop layer.

Example embodiment 11: The system of claim 8, 9, or 10, further comprising an interconnect layer underneath the gate electrode, wherein the top of the gate electrode is directly connected to the channel and the bottom of the gate electrode is directly connected to the interconnect layer.

Example embodiment 12: The system of example embodiment 8, 9, 10, or 11, wherein the width of the gate electrode is from 20 to 40 nm.

Example embodiment 13: The system of example embodiment 8, 9, 10, 11, or 12, wherein the thickness of the gate electrode is from 10 to 30 nm.

Example embodiment 14: The system of example embodiment 8, 9, 10, 11, or 12, wherein the source contact and the drain contact include a plurality of layers of materials.

Example embodiment 15: A method including forming etch stop material on an interconnect structure; patterning the etch stop material to form a plurality of vias; forming a gate conductor in the plurality vias to form a plurality of gate electrodes; forming a gate dielectric above the plurality of gate electrodes; forming channel material above the gate dielectric; forming a first interlayer dielectric above the channel material; forming a plurality of spaces in the interlayer dielectric, the channel material and the gate dielectric to define a plurality of active regions; forming a spacer material to line the plurality of spaces to define a plurality of isolation gaps; forming an isolation dielectric layer on the spacer material to fill the plurality of isolation gaps; forming a second interlayer dielectric layer above the plurality of filled isolation gaps; forming a plurality of source and drain contact spaces above the channel material wherein there is no lateral overlap of the plurality of gate electrodes and the plurality of source and drain contact spaces; and forming a plurality of source and drain contacts in the plurality of source and drain contact spaces.

Example embodiment 16: The method of example embodiment 15, wherein the width of the gate electrodes is from 20 to 40 nm.

Example embodiment 17: The method of example embodiment 15 or 16, wherein the thickness of the gate electrodes is from 10 to 30 nm.

Example embodiment 18: The method of example embodiment 15, 16, or 17, wherein the plurality of source and drain contacts include a plurality of layers of materials.

Example embodiment 19: The method of example embodiment 15, 16, 17, or 18, wherein the plurality of source and drain contacts include a single layer of material.

Example embodiment 20: A method, including forming a source contact and a drain contact; forming a first dielectric between the source contact and the drain contact; forming a channel under the source contact and the drain contact; forming a gate electrode below the channel, the gate electrode in an area under the first dielectric that does not laterally extend under the source contact or the drain contact; and forming a second dielectric above the gate electrode and underneath the channel.

Example embodiment 21: The method of example embodiment 20, wherein the gate electrode includes a conductive via.

Example embodiment 22: The method of example embodiment 20 or 21, further comprising forming an etch stop layer, wherein the gate electrode is formed in the etch stop layer.

Example embodiment 23: The method of example embodiment 21 or 22, further comprising forming an interconnect layer underneath the gate electrode, wherein the top of the gate electrode is directly connected to the channel and the bottom of the gate electrode is directly connected to the interconnect layer.

Example embodiment 24: The method of example embodiment 21, 22, or 23, wherein the width of the gate electrode is from 20 to 40 nm.

Example embodiment 25: The method of example embodiment 21, 22, 23, or 24, wherein the thickness of the gate electrode is from 10 to 30 nm.

Example embodiment 26: The method of example embodiment 21, 22, 23, 24, or 25, wherein the source contact and the drain contact include a plurality of layers of materials.

What is claimed is:

1. A device, comprising:
   a source contact and a drain contact;
   a first dielectric between the source contact and the drain contact, the first dielectric having an uppermost surface at a same level as an uppermost surface of the source contact and the drain contact;
   a channel under the source contact and the drain contact;
   a gate electrode below the channel, the gate electrode in an area under the first dielectric that does not laterally extend under the source contact or the drain contact;
   a second dielectric above the gate electrode and underneath the channel; and
   an interconnect layer beneath the gate electrode, the interconnect layer extending laterally beyond the source contact and the drain contact along a direction from the source contact to the drain contact.

2. The device of claim 1, wherein the gate electrode includes a conductive via.

3. The device of claim 1, further comprising an etch stop layer, wherein the gate electrode is formed in the etch stop layer.

4. The device of claim 1, wherein the bottom of the gate electrode is directly connected to the interconnect layer.

5. The device of claim 1, wherein the width of the gate electrode is from 20 to 40 nm.

6. The device of claim 1, wherein the thickness of the gate electrode is from 10 to 30 nm.

7. The device of claim 1, wherein the source contact and the drain contact include a plurality of layers of materials.

8. A system, comprising:
   one or more processing components; and
   one or more data storage components, the data storage components including at least one device, the at least one device including:
   a source contact and a drain contact;
   a first dielectric between the source contact and the drain contact, the first dielectric having an uppermost surface at a same level as an uppermost surface of the source contact and the drain contact;
   a channel under the source contact and the drain contact;
   a gate electrode below the channel, the gate electrode occupying an area under the first dielectric that does not laterally extend under the source contact or the drain contact;
   a second dielectric above the gate electrode and underneath the channel; and
   an interconnect layer beneath the gate electrode, the interconnect layer extending laterally beyond the source contact and the drain contact along a direction from the source contact to the drain contact.

9. The system of claim 8, wherein the gate electrode includes a conductive via.

10. The system of claim 8, further comprising an etch stop layer, wherein the gate electrode is formed in the etch stop layer.

11. The system of claim 8, wherein the bottom of the gate electrode is directly connected to the interconnect layer.

12. The system of claim 8, wherein the width of the gate electrode is from 20 to 40 nm.

13. The system of claim 8, wherein the thickness of the gate electrode is from 10 to 30 nm.

14. The system of claim 8, wherein the source contact and the drain contact include a plurality of layers of materials.

* * * * *